United States Patent [19]

Mukaiyama

[11] Patent Number: 4,517,519
[45] Date of Patent: May 14, 1985

[54] FSK DEMODULATOR EMPLOYING A SWITCHED CAPACITOR FILTER AND PERIOD COUNTERS

[75] Inventor: Fumiaki Mukaiyama, Suwa, Japan

[73] Assignee: Kabushiki Kaisha Suwa Seikosha, Tokyo, Japan

[21] Appl. No.: 318,496

[22] Filed: Nov. 5, 1981

[30] Foreign Application Priority Data

Nov. 7, 1980 [JP] Japan .................................. 55-157193
Mar. 16, 1981 [JP] Japan .................................. 56-37602

[51] Int. Cl.³ ........................ H03D 3/00; H04L 27/14
[52] U.S. Cl. .................................... 329/126; 329/107; 329/110; 375/45; 375/88; 375/94; 375/95; 375/103
[58] Field of Search .................. 329/50, 107, 110, 126; 375/45, 47, 48, 88, 89, 90, 94, 95, 96, 103, 104

[56] References Cited

U.S. PATENT DOCUMENTS 3,636,257 1/1972 Dixon .................................... 375/45
3,657,661 4/1972 Jarger .................................... 329/50

FOREIGN PATENT DOCUMENTS 131705 7/1978 German Democratic Rep. ..................................... 329/107

OTHER PUBLICATIONS

Budai, Z., "Type TAM-600 Data Transmission Modem" Budavox Telecommun. Rev., pp. 8-16, n. 4 (1974).
Hosticka, B. J. et al., "MOS Sampled Data Recursive Filters Using Switched Capacitor Integrators", IEEE Journal of Solid State Circuits, v. SC-12, n. 6, pp. 600-608, Dec. 1977.

Primary Examiner—Eugene R. LaRoche
Assistant Examiner—W. R. Paxman
Attorney, Agent, or Firm—Blum Kaplan Friedman Silberman & Beran

[57] ABSTRACT

An FSK demodulation circuit especially suited for integrated construction is provided. The demodulating circuit uses N counters and a counter selector circuit for sequentially switching the counters at every zero-cross point in the received FSK signal. Sensitivity of demodulation is improved by N-time zero-cross detection rather than counting the time between two adjacent zero-cross points. The FSK demodulation circuit uses a Switched Capacitor Bandpass Filter whose characteristics are changed by changing the frequency of an internal clock using simple dividing circuitry.

7 Claims, 13 Drawing Figures

FSK DEMODULATOR EMPLOYING A SWITCHED CAPACITOR FILTER AND PERIOD COUNTERS

BACKGROUND OF THE INVENTION

This invention relates generally to frequency shift keying demodulation circuitry and more particularly to frequency shift keying demodulation circuitry used with telecommunications equipment, such as a computer modem. In the art of FSK transmission, a unique tonal frequency is used to represent each piece of information. In order to represent a binary piece of information, two distinct tonal frequencies are necessary, one to represent a logical zero and one to represent a logical one. These two tones are known together as a frequency pair. In order to allow simultaneous full duplex communication, an originate frequency pair and an answer frequency pair have been defined by the prior art.

The key elements in the construction of an FSK demodulation circuit are a filter and a transformation and demodulation circuit used for transforming the incoming analog tonal frequency signal into a corresponding digital signal. In the FSK modems of the prior art, LC filters or other active filter circuits, which employ capacitors, resistors and an operational amplifier, are used. In the demodulation circuit of the prior art, a phase locked loop circuit is utilized. The filter and demodulation circuit must be accurate and have a narrow operating range in order to discriminate between both the zero frequency and the one frequency of the originating unit and the zero frequency and the one frequency of the answering unit.

In the filter units of the prior art, many inductive coils, resistors and capacitors of high precision are required. This yields a filter which is large in size and high in cost. Additionally, accurate adjustment of the filter is difficult and the aging of the components may cause the modem to fall out of specification. The demodulation circuit must also be large in size, as well as expensive, because of its need for high quality capacitors and resistors.

It is also noted that it may be desirable to have both the originating unit and answering unit transmitting simultaneously. This is known as full duplex communication. In such an instance, four distinct frequencies are required for FSK communication; a zero frequency and a one frequency for the originating units and a zero frequency and a one frequency for the answering unit. In order to have each modem operate as either an originating unit or an answering unit, it is necessary to have two complete sets of filters and demodulation circuits in each modem. Thus, the above mentioned disadvantages of size and cost are multiplied in a full duplex unit and complicated switching arrangements are necessary for full duplex operation.

It is the object of this invention to provide an FSK demodulation circuit wherein the filter and demodulation circuits are simple in construction, reliable and inexpensive to produce.

SUMMARY OF THE INVENTION

Generally speaking, in accordance with the invention, a frequency shift keying (FSK) demodulation circuit is provided. The FSK circuit of the invention is well suited for unitized construction as an integrated circuit. The FSK demodulation circuit of the invention utilizes switched capacitor filters, hereinafter referred to as SCF, as an incoming signal band pass filter. The FSK demodulation circuit of the invention may be used as an inexpensive low speed computer modem and is particularly well suited as an acoustically coupled modem.

The FSK demodulation circuit of the invention operates at low speed, but is capable of full duplex communication through the use of a series of input filters which reject those frequencies being transmitted by the modem. The quality of the filter is important since, particularly in an acoustically coupled modem, the signal being sent by the modem also returns to the receiving side of the modem directly through the telephone hand set and telephone network. Therefore, high precision filtering must be provided in order to separate the signal received from the signal sent. Costly LC filters have been used by the prior art, but selection and adjustment of the components of these filters is difficult and the aging of the components of the filters causes the filters to go out of alignment, requiring frequent adjustment. This has led to modems which are expensive to manufacture and large in size.

Recently, an integrated filter element has been developed in which the resistance elements are replaced with an operational amplifier, a capacitor, and a switching element. This integrated filter is called a switched capacitor filter (SCF). The operating characteristics of these SCF filters, namely, bandwidth, center frequency and filter type, are determined in accordance with the ratio of the various switched capacitor values and also the clock frequency. The clock frequency is precisely controlled through the use of a crystal oscillator, and the value of the capacitor can be determined during production of the filter using integrated circuit manufacturing techniques.

Thus, a filter is provided which is adjustment-free and capacle of high precision. The filter is a sampling filter, and the ratio of the clock frequency to the applicable frequency domain is normally several times 10. This means that the SCF has the property that its pass band will change in accordance with a change of clock frequency. If the clock frequency is doubled, the frequency of the pass band is doubled. In the instant invention, the clock frequency is varied using divider circuitry.

Also shown in the invention is a demodulation circuit for changing incoming analog frequency tones into digital ones and zeros using an N-part counter and a counter selector circuit which detects the zero-cross point of the received FSK signal. Sensitivity of demodulation is improved by averaging the cross point measurement N times rather than counting the time between two adjacent zero cross points.

Accordingly, it is an object of this invention to provide an improved FSK demodulation circuit which includes an SCF and demodulation circuit and which can be integrated on a single chip.

Another object of the invention is to provide an improved FSK demodulation circuit which is less susceptible to distortion, and admits of an improved error rate and which can accomplish accurate demodulation of even weak input signals.

A further object of the invention is to provide an improved FSK demodulation circuit which can be used in both an orignate mode and an answer mode by varying the clock signals to the switched capacitor filter unit.

Still another object of the invention is to provide an improved FSK demodulation circuit which can easily be adapted for use with the various transmission standards used in different countries.

Yet another object of the invention is to provide an improved FSK demodulation circuit for use in a modem which is low in cost and small in size.

Still other objects and advantages of the invention will in part be obvious and will in part be apparent from the specification.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
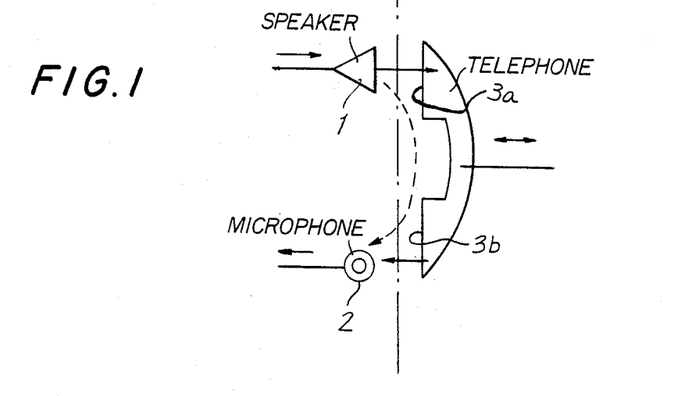
FIG. 1 indicates the audio data flow for an acoustical modem.

Referring now to FIG. 1, the audio signal path for a conventional acoustically coupled FSK modem is shown. The incoming signal from the distant party is received in the earpiece 3A of the telephone handset 3 and is fed into the modem through the modem microphone 2. The outgoing signal of the modem is broadcast by the modem's speaker 1 and is fed into the telephone microphone 3B in handset 3 and onto the telephone lines. Telephones are designed so that when a speaker speaks into the microphone of his handset he will be able to hear his own voice in the earpiece of the same handset. Unfortunately, this presents a problem in the case of data communications in that the outgoing signals and the incoming signals are mixed. In order to separate these two signals, and to provide communications integrity, the incoming signal is directed through a band-pass filter. While it may be possible in some instances to reduce the internal feedback of a telephone unit by altering the arrangement of the telephone's hybrid transformer, it is impossible to totally eliminate feedback since there is always some residual feedback due to impedance mismatch. For this reason the performance of the band pass filter is critial to effective demodulation capability and the reduction of the signal-to-noise ratio of the modem.

Figure 2:
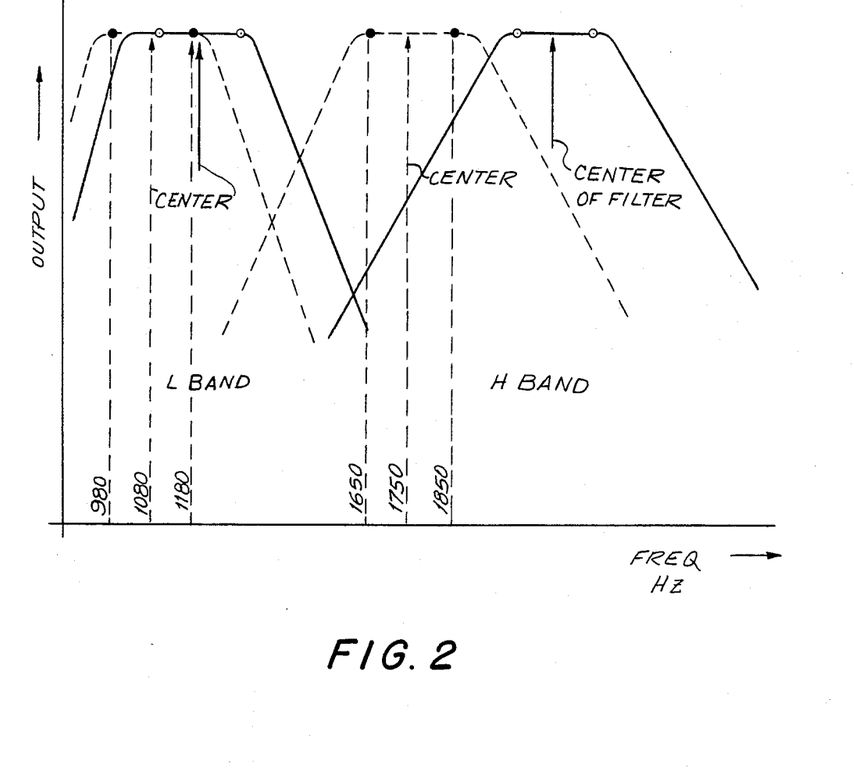
FIG. 2 shows the originate and answer frequencies of various FSK modem standards in general use.

Referring now to FIG. 2, a frequency chart is shown illustrating various FSK modem communication signal standards. Among the standards in use worldwide are the CCITT standard, and the Bell standard.

In the CCITT standard, an originate mark or logic "1" has a frequency of 980 Hz, and originate space or logic "0" has a frequency of 1180 Hz, an answer mark has a frequency of 1650 Hz, and an answerspace has a frequency of 1850 Hz.

In the Bell standard an originate mark has a frequency of 1070 Hz, an originate space has a frequency of 1270 Hz, an answer mark has a frequency of 2025 Hz, and an answer space has a frequency of 2225 Hz.

The CCITT standard is used primarily in Europe and Japan and will be the basis of calculations performed herein. It is to be understood that Bell standard frequencies may also be used in embodiments of the invention.

As can be seen, it is necessary in a modem to employ a band pass filter in order to separate the originate group of signals from the answer group of signals. This allows for full duplex operation and prevents the mixing of the signals. Additionally, the filter must be set to the proper pass band before operation begins and should be switchable to allow a modem to operate in either originate or answer mode.

Figure 3:
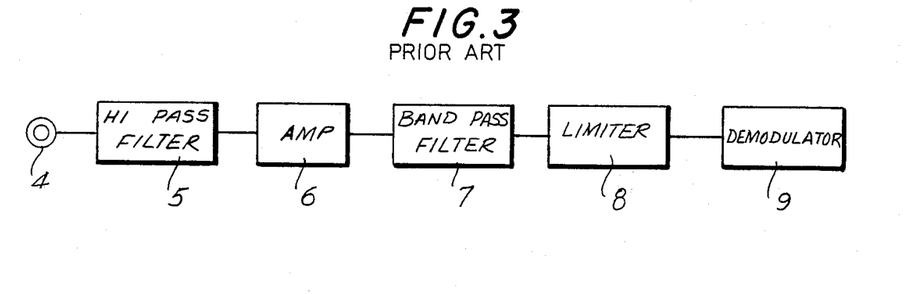
FIG. 3 is a functional block diagram of a conventional FSK demodulation circuit.

Referring now to FIG. 3, a functional block diagram of a conventional FSK demodulation circuit is shown. The FSK demodulation circuit utilizes a microphone 4, a high pass filter 5, an amplifier 6, a band pass filter 7, a limiter 8 and a demodulation or transformation circuit 9. The highpass filter 5 is used to isolate impulse and vibrational noises on the telephone line.

The demodulation circuit converts the incoming frequency tones into digital signals representing logical ones and zeros. The demodulation circuit 9 may be a system which measures a level difference in the signal coming out of the band pass filter 7 which would correspond to a mark and space, it may be a system which utilizes a voltage controlled oscillator and a phase lock loop to demodulate the incoming audio signals, or it may be a system which measures the period of the incoming signal to determine frequency and thereby output a logic one or a zero.

The band pass filter 7 must be changed by switching, as described above if the unit is to be able to operate in both originate and answer modes. This switching will change the pass band frequency to allow either originate frequencies or answer frequencies to be received by the demodulator. In a conventional modem circuit two LC filter systems are provided, one designed to pass originate frequencies and one designed to pass answer frequencies, in order to allow the modem to operate in full duplex mode and to be switchable between originate and answer mode. This is an expensive construction practice.

Figure 4:
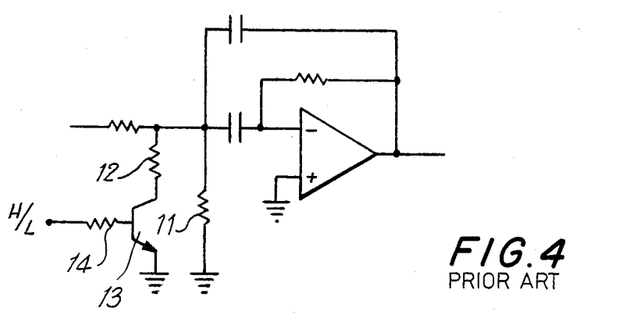
FIG. 4 is a schematic representation of a conventional RC active filter for use with a conventional FSK demodulation circuit.

Referring now to FIG. 4, a a known filter is shown which has a switchable pass band. Three of these secondary RC active band pass filters are connected in three stage cascade in order to create a six pole filter having a very large Q or sharp peak. In the filter, configuration of resistances 11 and 12 at the input of the operational amplifier is changed by use of transistor 13 in series with resistor 12. When transistor 13 conducts, resistors 11 and 12 are connected in parallel; but when the transistor 13 is in a nonconductive mode, only resistor 11 is active in the circuit. A switching signal designated as H/L is applied to the base of the transistor 13 through a base resistance 14. A high level signal H turns transistor 13 on and allows the filter to pass answer mode frequencies. A low level signal L turns transistor 13 off and allows the filter to pass low band originate frequency. In practice, three stages of switching circuits are required to achieve a sharp six pole filter effect. This makes the selection of resistors and capacitors and adjustment of these components very difficult. Moreover, the long term reliability and temperature stability of these components is low, thus making it difficult to maintain the correct operation of the RC active filter. In design, these aging and temperature shifting characteristics must be taken into consideration for circuit design and this results in the design of an RC filter which has a broader pass band than might otherwise be desirable in order to provide for continued operation over time and temperature.

Figure 5:
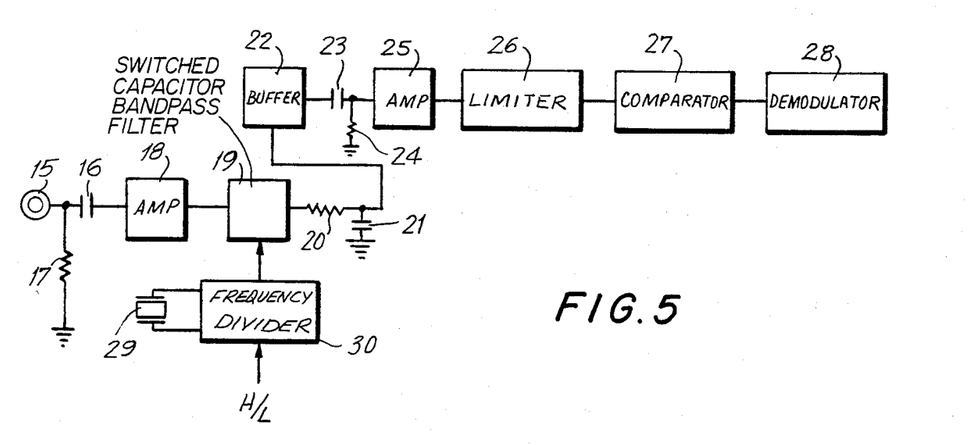
FIG. 5 is a semi-schematic block diagram of an FSK demodulation circuit made in accordance with the invention.

Referring now to FIG. 5, a semi-schematic block diagram of a demodulation circuit utilizing switched capacitor filters in accordance with the invention is shown. The use of the switched capacitor filter results in high filtering precision without requiring any adjustment to the circuit. Additionally, reliability, miniaturization and low cost are achieved through the total integration of the circuit. As shown in FIG. 5, a received signal is input to SCF 19 from microphone 15 after passing through a high pass filter which is made up of capacitor 16 and resistance 17, and then through amplifier 18. This high pass filtering circuit removes line and impulse vibrational noise from the incoming signal.

The switched capacitor filter utilizes clock frequencies which are summed in a stepwise fashion to provide an output signal. This output signal contains clock noise and the clock noise is eliminated from the signal through the use of a low pass filter consisting of resistor 20 and capacitor 21. Additionally, a signal offset which is due to the operational amplifier is eliminated through the use of buffer 22 and a high pass filter consisting of capacitor 23 and resistor 24. A folded noise prevention filter is not required since the energy in the folded domain of the high band is virtually non-existent.

FIG. 5 also illustrates the use of an amplifier 25, a limiter 26, a comparator 27 and a demodulator 28 in a demodulation circuit. The demodulator circuit 28 uses a counter to convert the incoming frequency tones into digital logic one and zero signals. Demodulator 28 measures the period of the square wave which is output from comparator 27. The counter can be constructed entirely of logic circuitry and is readily integrated into the modem assembly. The demodulator requires the use of an input signal having a low noise level, but this can be achieved by using a high quality switched capacitor filter. Amplifiers 18 and 25 are positioned before and after the switched capacitor filter in the signal chain so as to satisfy the following two contradictory requirements simultaneously. First, it is important to utilize a switched capacitor filter which has a comparatively large noise component at a circuit position having high signal levels. However, it is also important to utilize the switched capacitor filter at an operating level as low as possible so as to prevent the SCF from clipping and thereby providing a distorted waveform output due to noise. The high pass filter, provided by buffer 22, capacitor 23 and resistor 24, prevents limiter 26 from operating on a signal that is greater than the plus side or the minus side of the waveform, and also forms an accurate zero crossing comparator by coupling AC only to limiter 26 and comparator 27. Thus, demodulation capability is not impaired when the circuit is presented with an overload signal.

The clocking system necessary for use with the switched capacitor filter can be constructed with a frequency dividing circuit 30 which has a crystal oscillator 29 and which is capable of two frequency dividing ratios. These frequency division ratios provide clock signals to the SCF which allow it to operate in the pass band of either the originating signals or of the answer signals according to whether the H/L input is high or low. For example, if the switched capacitor filter is to pass originate frequencies of the CCITT standard, which are 980 Hz and 1180 Hz for mark and space respectively, then the SCF should have a center pass band frequency of 1080 Hz. On the other hand, if the SCF is to be responsive to answer signals having a frequency of 1650 Hz and 1850 Hz for mark and space, respectively, then the SCF will have a center pass band of 1750 Hz. To be compatible with the Bell standard, the center frequencies will be 1170 Hz for originate mode 2125 Hz for answer mode.

Assuming now, for example, that the ratio of the band pass center frequency to the SCF clock frequency is 58; the clock signal for the SCF will be 58 times the 1080 Hz center frequency used in originate mode. This means the SCF clock frequency will be 62.64 kHz. On the other hand, if the SCF is used in answer mode, then the clock frequency will be 101.5 kHz, which is 58 times the originate center frequency of 1750 Hz. Therefore, the two clock frequencies suitable for use with the CCITT standards may be obtained by taking a crystal frequency of 1 MHz and using frequency dividing ratios of 16 and 10. The switched of the SCF clock frequency between 62.64 kHz. and 101.1 kHz does not have to be done as a high speed operation, and thus a simple circuit configuration is possible for use as the frequency dividing circuit. Thus, is accordance with the invention, a switched capacitor filter is obtained which can be used both as an originate filter and an answer filter and may be switched entirely through the use of simple logic circuits, without the need to change values for capacitors and resistors. Additionally, the area of an integrated circuit chip used as the operational amplifier can be decreased somewhat and power consumption will also be lowered.

Figures 6, 7:
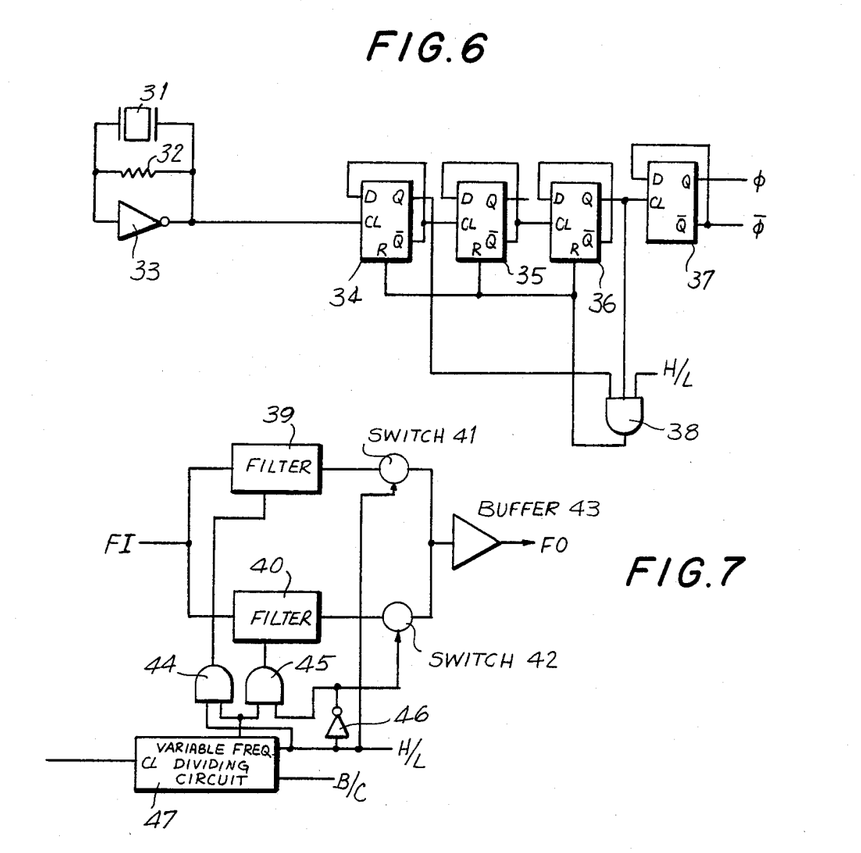
FIG. 6 is a schematic diagram of one embodiment of the frequency divider circuit shown in FIG. 5.
FIG. 7 is a circuit diagram for a clock circuit used with an SCF in an FSK demodulation circuit made in accordance with the invention.

Referring now to FIG. 6, a circuit is shown for a variable frequency dividing circuit in accordance with the invention. The circuit in FIG. 6 corresponds to crystal 29 and frequency divider 30 of FIG. 5. A crystal resonator 31 oscillates at a frequency of 1 MHz in conjunction with a CMOS inverter 33 and feedback resistor 32 to provide an oscillator circuit. This output clock signal is input to a series of frequency dividing stages consisting of D type flip-flops 34, 35 and 36. These flip-flops are capable of dividing the input 1 MHz signal by 1/8 or 1/5. The three-input AND gate 38 receives the outputs of flip-flops 34 and 36 and a high-low selector signal. H/L. When the high-low input is at the high level, the output of the AND gate 38 goes high when flip-flops 34 and 36 are also high. This occurs only after 5 pulses from the oscillator circuit, which places flip-flop 34 in a logic one state, flip-flop 35 in a logic zero state and flip-flop 36 in a logic one state. The output of AND gate 38 then goes high and resets counters 34, 35, 36 to 000 whereby the frequency output on the Q terminal of flip-flop 36 is equal to 1/5 of the oscillator frequency.

Alternatively, when the high-low signal is held at a low level, no reset operation is performed on flip-flop stages 34 through 36 and flip-flop 36 provides an output which is equal to 1/8 of the frequency of the oscillator clock output. The output of the divider is to be taken from the Q output of flip-flop 36. It is noted that the duty cycle of the output is not 1:1 when the 1/5 frequency division is selected. The output level is maintained high for the time during which the output is given by a binary 100 and also for a delay time until a reset state of 101 occurs. Finally, the output of flip-flop 36 is fed to flip-flop 37 which further divides the signal by 2 providing $\phi$ and $\bar{\phi}$ outputs which are equal to the clock frequency divided by 10 and the clock frequency divided by 16, respectively. This produces output frequencies of 100 kHz and 62.5 kHz.

Referring now to FIG. 7 another embodiment of a switched capacitor filter circuit is shown. The switch capacitor filter shown in FIG. 7 is an improvement over that shown in FIG. 6 in that the SCF of FIG. 7 takes advantage of the phenomenon in which the band-width of a band pass filter changes in accordance with an increase in the SCF clock frequency; that is the passband is widened as the center frequency is increased. This circuit in addition to an input for a high-low signal H/L is provided with an input for a switching signal B/C which adapts the SCF to either the CCITT FSK standards or the Bell FSK standards. An answer group band pass filter 39 and an originate group band pass filter 40 are both constructed as switched capacitor filters to which the input signal FI is fed. Analog switches 41 and 42 are used as output selectors for the originate or answer filters, feeding buffer 43 which serves as the output stage of the filter system and delivers the filter output FO. The system indicated in FIG. 7 is useful for obtaining an optimal band width used with originate and answer filters respectively. Therefore, the filter shows different characteristics based on which standard, CCITT or Bell, is to be used.

For example, for an originate group receiving mode, the arrangement of the circuit is such that AND gate circuit 44 is not selected while AND gate 45 is selected to input the system clock signal. AND gate 44 and AND gate 45 are alternately selected by means of a high-low input signal H/L respectively applied directly and via an inverter 46. Thus, the answer group band pass filter 39 is kept from receiving a clock signal to prevent the occurrence of noise from the operation of the unused switch capacitor filter and also used to reduce cross-talk. Analog switch 42 passes the signal through to buffer 43 and analog switch 41 blocks any feedback of the signal when the high-low switch is set in a low condition.

As shown in FIG. 7, variable frequency dividing circuit 47 is capable of generating the four different clock frequencies which are necessary for receiving CCITT originate and answer signals and Bell originate and answer signals. These signals are selected by signals H/L and B/C. Dividing circuit 47 is substantially similar to the circuit depicted in FIG. 6, but is adapted to clock frequencies suitable to both Bell and CCITT standards. In this way a modem is adaptable for a variety of purposes and has a wide range of utility. Additionally, the same integrated circuit can be used in a modem which is produced for one or the other standard, as well as being used for multiple standards. Thus, costs in production can be lowered.

Figure 8:
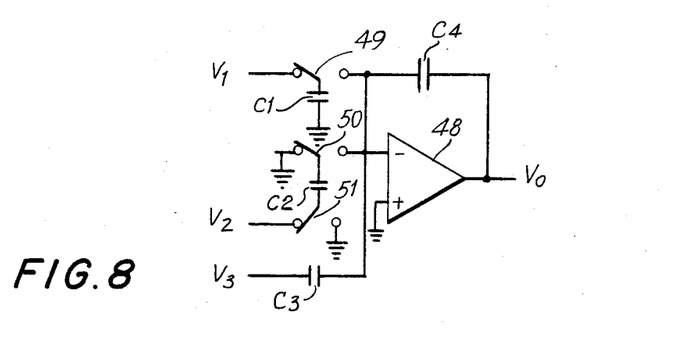
FIG. 8 is a basic schematic representation of an SCF made in accordance with the invention.

Referring now to FIG. 8, the basic circuit for a switched capacitor filter for use with the invention is shown. The circuit of FIG. 8 utilizes an operational amplifier 48, capacitors C1 through C4, and analog switches 49 through 51 which are produced by MOS techniques. $V_1$ is an input to the integrated circuit which provides an output which is equal to $$V_0 = -(1/S) \times (C_1 f_s/C_4) V_1.$$

an integrator having a large time constant can be constructed only by using the ratio of clock frequency $f_s$ to the capacitors C1 and C4. $V_2$ is a non-inverting integrating input, and the equation:

$$V_0 = (1/S) \times (C_2 f_s/C_4) V_2$$

is obtained by inputting $V_2$ to operational amplifier 48, and inverting at switches 50 and 51. $V_3$ functions as an inverting input and is capable of providing an element necessary for filter construction, where:

$$V_0 = -(C_3/C_4) V_3$$

in which the condenser ratio is a coefficient. In the above equations, $S = 2\pi f x j$, where f is the band frequency and j is the square root of minus 1. The clock signal is applied in operation to switches 49, 50 and 51.

Turning now to the demodulation portion of an FSK modem, we can see in FIG. 5 that demodulator 28 is the last element in our signal chain. The demodulator will receive an audio frequency signal of either originate or answer mode, representing either a mark or space (logic 0 or logic 1) signal and outputting a binary digital signal corresponding to said 1 and 0. In the conventional art, demodulation is facilitated through the use of a phase lock loop detector. Additionally, a system is used which will retrieve an original binary signal through demodulation by detecting the zero-cross point in the signal which is passed through a filter system. By counting the period of the signal on a counter, comparison values are obtained and a differentiation between 0 and 1 signals can be determined. These circuits can be integrated for miniturization, improvement in reliability and reduction in costs and power consumption.

With reference to the above mentioned counter demodulation technique, a disadvantage appears with the counter system in that the demodulation of a signal which may have a low signal to noise ratio will cause an increase in signal distortion and even the possibility of no demodulation because of the susceptibility of the zero-cross method to errors in detecting zero-cross points in noise. When used in full duplex communications, as in a low speed modem, this problem appears because of the leakage of the transmitted frequencies into the receiving portion of the modem. In the case of an acoustically coupled modem, an even greater influence results from the noise of the side tone by which the sending signal is returned to the receiving microphone within the telephone. Therefore, it is crucial that careful attention be paid to the design of the frequency and noise characteristics of the filter circuits as well as the noises generated externally.

The demodulation circuit constructed in accordance with the invention is an improvement over the disadvantages pointed out above and provides the ability to demodulate a signal having a high noise level component even when using zero-cross point counter methods.

Figure 9:
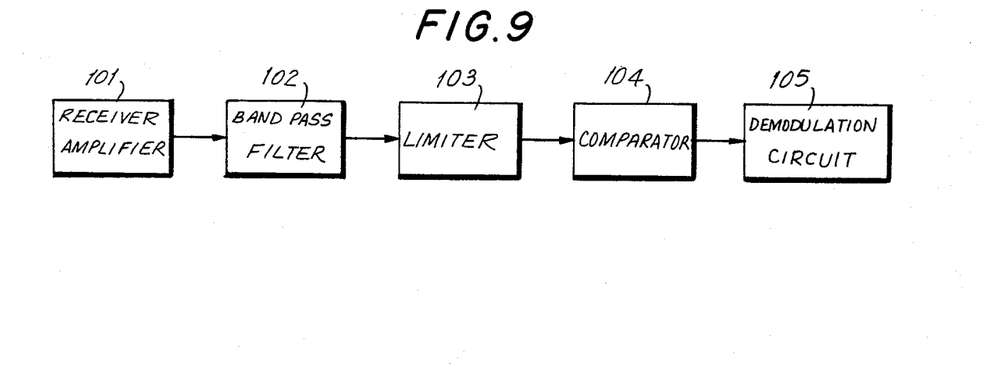
FIG. 9 is a functional block diagram of another embodiment of the invention showing an FSK demodulation circuit made in accordance with the invention.

FIG. 9 is a functional block diagram of a FSK demodulation circuit in accordance with this invention. The FSK demodulation circuit comprises a receiving amplifier 101, a band pass filter 102, a limiter 103, a comparator 104 and a demodulation circuit 105. A received signal is amplified, without allowing the amplitude to exceed a clip level. The received signal has any signal of the opposite band and other noises removed through the band pass filter 102 and is then limited in amplitude by the limiter 103 so that an operational amplifier, for example in comparator 104, will not be saturated. The signal is outputted from comparator 104 in digital form representing the FSK information of the signal. Zero-cross information is obtained through a level change in the output of the comparator and is demodulated digitally using a value obtained by counting a basic clock between the zero-cross periods in a counter of the demodulation circuit as explained more fully hereinafter. In comparison with a conventional analog demodulation system, the above system is adaptable for integration, requires no particular adjustment and has no fluctuation in performance for a long period of time.

Figure 10:
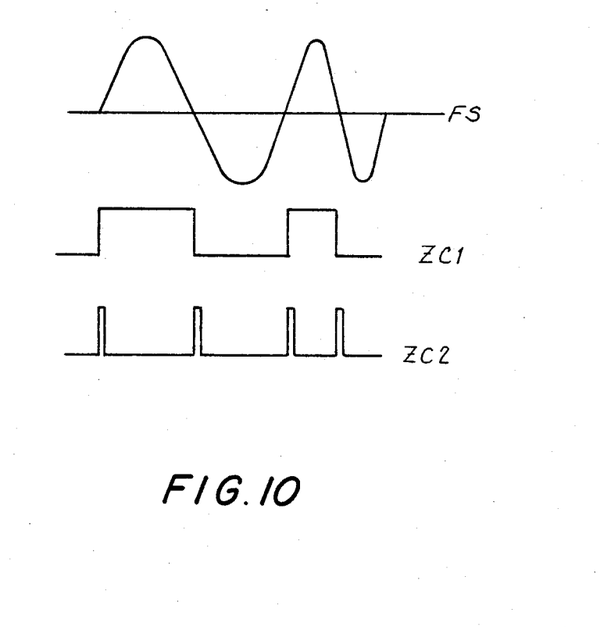
FIG. 10 illustrates a series of waveforms used with a zero-cross detection method in accordance with the invention.

FIG. 10 is a timing chart of a zero-cross period detection process in accordance with this invention. The received FSK signal FS has its positive and negative portions converted into a square wave format ZC1 by the comparator 104. Note that the positive portions of the signal FS take on the high binary level whereas the negative portions of the signal FS take on the low level. Durations of the highs of the wave form ZC1 correspond with the durations of the positive portions of the signal FS respectively. A signal ZC2 is obtained by differentiating the rise and fall points of the signal ZC1 and these narrow pulses ZC2 are used for resetting and reading a counter.

Figure 11:
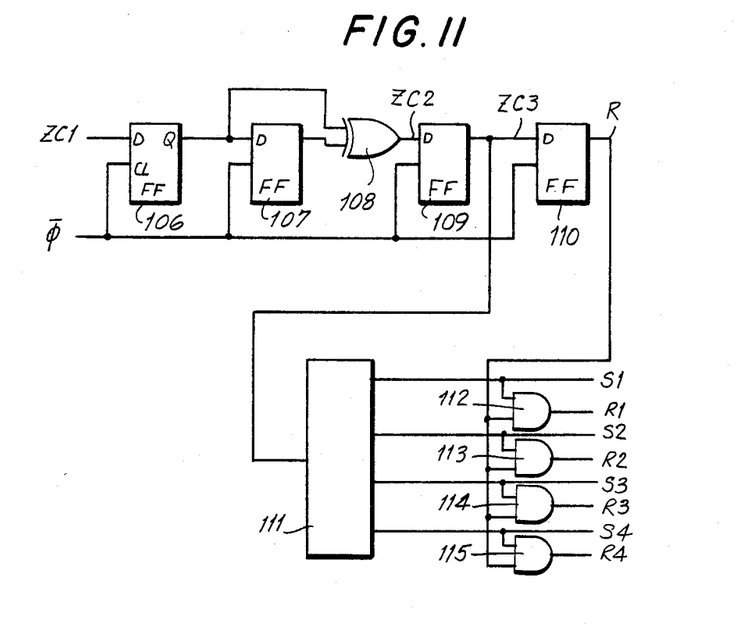
FIG. 11 shows a counter selection circuit for use with an FSK demodulation circuit made in accordance with the invention.

FIG. 11 is a circuit diagram of a counter selector circuit used in an embodiment of a FSK demodulation circuit in accordance with this invention. The counter selector circuit comprises D type flip-flops 106, 107, 109, 110, an exclusive OR gate 108, a quarter frequency dividing circuit 111 and AND gates 112-115. A differentiated signal ZC2 for zero-cross period detection is obtained through the flip-flops and gates 106-108. The signal ZC3 is obtained through shaping and delaying the ZC2 outputs in flip-flop 109. Outputs S1, S2, S3, S4 are produced and outputted selectively in sequence by the quarter frequency dividing circuit 111. Then, a signal R, obtained from the flip-flop 110 through further delaying the signals ZC3 with a primary clock $\bar{\phi}$, is multiplied logically by the outputs S1-S4 in the AND gates 112-115, respectively, to produce reset signals R1-R4 respectively. These signals R,S are applied to counters as described hereinafter.

Figure 12:
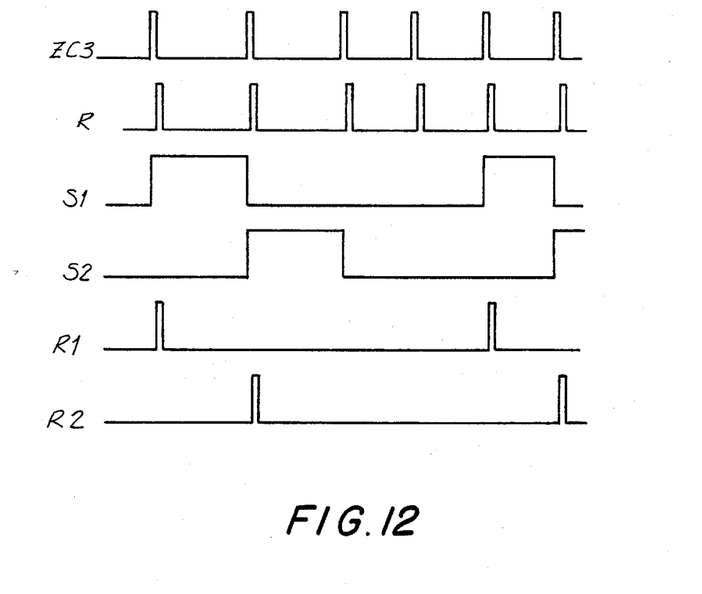
FIG. 12 shows the waveforms associated with the counter selector circuit of FIG. 11.

FIG. 12 is a set of wave forms showing the timing of signals of the counter selector circuit (FIG. 11) in accordance with this invention. Selective outputs are obtained, as S1 changes to S2, by synchronizing the signal with ZC3, which is a zero-cross period signal, and through synchronizing with its delayed signal R. Reset and read signals R1,R2 are also obtained at the AND gates. The signals R1-R4 are delayed relative to their respective selective outputs S1-S4 by a time period of the primary clock $\bar{\phi}$ so that the selective outputs are thoroughly stabilized. Then, the signals R1-R4 provide for delayed reset and read of the counter.

Figure 13:
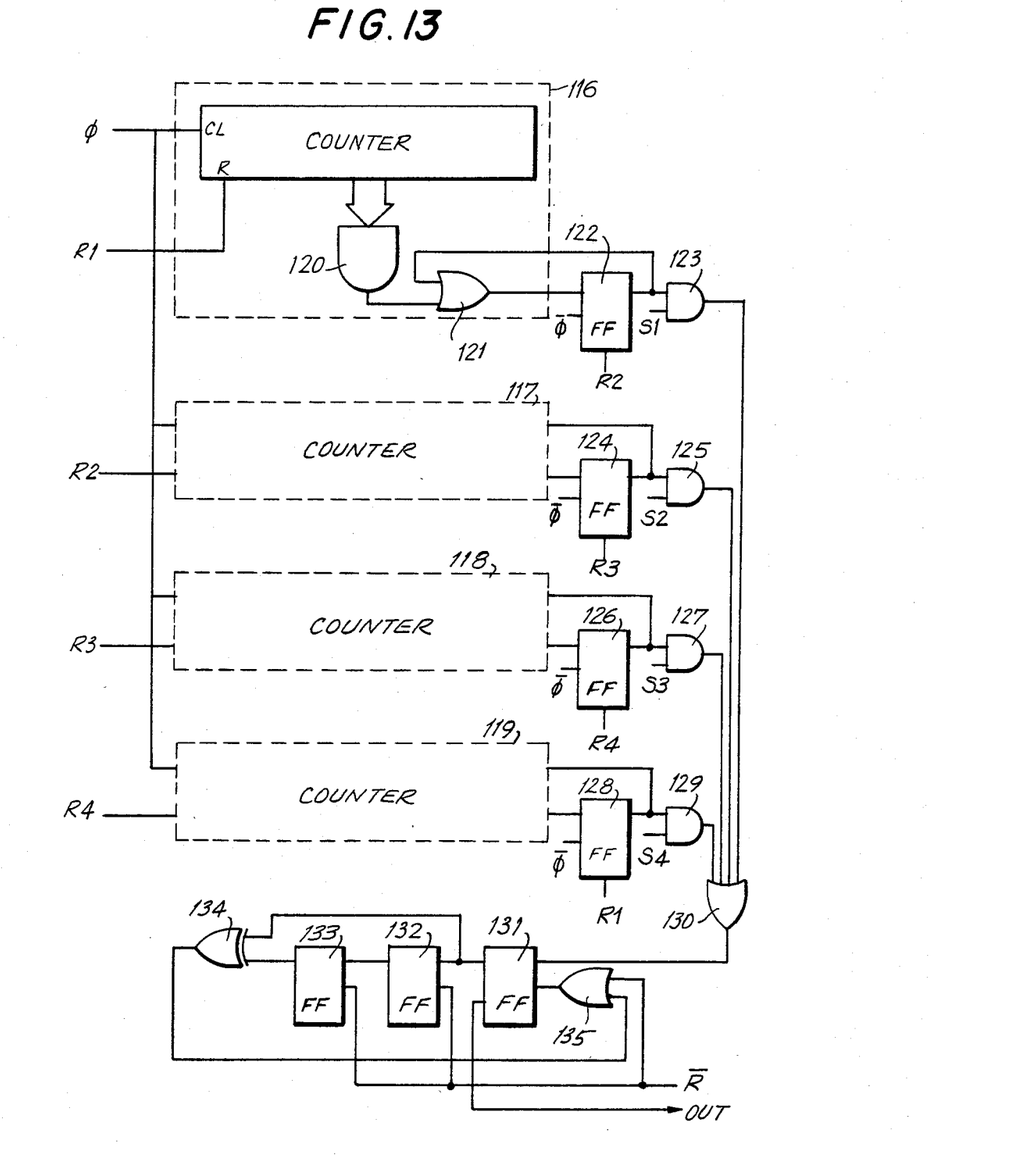
FIG. 13 shows a circuit diagram of the N-part counter of an FSK demodulation circuit made according to an embodiment of the invention.

FIG. 13 is a circuit diagram of a counter used in an FSK demodulation circuit in accordance with this invention. The counter is comprised of a N-part counter (N=4). Counters 116-119 have a discriminating circuit for demodulation of binary signals 1,0 respectively. The counter 116 comprises a gate 120 to detect thresholds "1", "0" of a given number of bits outputted from a ripple counter 116A. The counter 116 also comprises an OR gate 121, a D type flip-flop 122 and an AND gate 123 to store the output from the AND gate 120. Values are counted up by resolution of the primary clock signal $\phi$ and stored separately from a signal on the low frequency side of the FSK signal. That is, when the received signal is of the lower frequency, the period between zero-crossing is long and the stored count of clock pulses $\phi$ is large, exceeding the threshold between 1 and 0. Such a large count is discriminated as "0" for low frequency and the corresponding bit value is stored in flip-flop 122 where a single stored bit indicates whether a mark or a space is received. The clock is maintained at phase $\phi$, because the counter selector circuit is actuated at $\bar{\phi}$, to output S1, R1, and the phase is shifted from that at the counter selector circuit to prevent an erroneous operation of the clock of flip-flop 122, also operating at $\bar{\phi}$. The flip-flops and AND gates 124-129 function similarly in pairs in a manner similar to flip-flop 122 and gate 123.

Now operation of the counter 116 is described. Because the counter 116 is selected at the time when the signal S1 applied to the gate 123 is high and reset by the signal R1 immediately following the signal S1, the flip-flop 122 holds its output signal, indicating whether or not a period value of counts, accumulated in the period S1+S2+S3+S4, has exceeded the threshold of the gate 120. The period S1+S2+S3+S4 is equivalent to one cycle of signal ZC1 before the counter 116A is reset. The output of the flip-flop 122 is therefore selected as a read signal by the gate 123 with the signal S2 applied, and the output is sent to an output processing circuit by way of an OR gate 130.

While the flip-flop 122 outputs a signal during period S1 as a result of discrimination, it is reset by the signal R2 shortly after the rise of the signal S2 pending selection, and waits to store the next count.

The counters 117-119 operate in exactly the same way as does the counter 116. The time width for counting of these counters is four times that of the zero-cross detection period, that is, the time for counting is S2+S3+S4+S1 for the counter 117, and for the counter 118 the period is S3+S4+S1+S2, and for the counter 119 the period is S4+S1+S2+S3. Thus, each counter is put into operation at an interval shifted by one period of the zero-cross period, and a new read-out of the result is obtainable at every zero-cross period.

The output of the OR gate 130 is inputted to the output processing circuit comprised of D type flip-flops 131, 132, 133, an exclusive OR gate 134, and an OR gate 135. Two clocks of the signal $\bar{R}$ at every zero-cross period detection are prohibited by the OR gate 135 and then held after an output OUT changes so as to prevent the output OUT from changing abruptly when noise increases extraordinarily. The output OUT is produced at a high (H) level when the FSK signal comes in at the higher frequency; and the output OUT is at the low level when the FSK signal comes in at the lower frequency. Thus, the FSK signal is demodulated. The point where the output changes is obtained by R through the fall of R. However, since each counter is kept operating for counting until $\overline{R}$ rises, they are once reset by R and then outputs of the flip-flops 122, 124, 126, 128 are taken in to obtain a stable output.

The invention is intended, as described, for demodulation according to the count values during the four-fold zero-cross period. In further amplifying upon the effect of the invention, an original signal and noise are added at the zero-cross detection points to produce an error in the zero-cross detection period, which produces a signal distortion or error. It is unnecessary to say that the period error caused by noise is measured according to the ratio in level of noise to signal. The larger the noise level the greater is the period error. However, the error is equivalent at each zero-cross point, therefore, the signal to noise ratio is improved relatively by counting for a plurality of zero-cross periods and accumulating period values of the signal. Namely, when the period value to discriminate counter values becomes N times, the error introduced by analog noise which results at both the start and stopping points of the counter by overlapping the zero-cross point, just corresponds to the noise generated when counting for only one zero-cross detection period. Hence, there is a twelve dB improvement in accordance as the signal noise ratio is improved N times, e.g., in the illustrated example (FIG. 13), four times.

Furthermore, an advantage of this invention is that the difference occurring when the FSK signal changes can be increased, when using the zero-cross point selection for discrimination, by accumulating a plurality of zero-cross detection periods on a plurality of counters, as described. Thereby, the signal to noise ratio and discriminating precision are improved. In other words, the FSK signal changes comparatively slowly and continuously by influence of the filter and the circuit.

Assuming that zero-cross periods follow consecutively T1→T2→T3→T4→T5 and T1→T2→T3→T4→T5, an output of the counter (FIG. 13) makes a change from the count periods from T1+T2+T3+T4 to the count of T2+T3+T4+T5 at the next zero-cross detection. Then the difference in change of the counter value becomes large, that is, T1−T5, which is larger than the difference between adjacent periods T1 and T2, thus, improving detection precision.

In accordance with the invention, a modulator-demodulator circuit can easily be manufactured. The high precision switch capacitor filter described above can be enclosed on the same integrated circuit and will operate at all times on a zero-cross comparator output in the same trigger direction. This corrects a condition where it is easy to produce an imbalance more or less as it is difficult to take a zero-cross point of the comparator perfectly at the mid-point between the positive side and the negative side of the signal. Then, as in the case of the limiter, it is also not easy to limit amplitudes while keeping a balance between the positive side and the negative side, and hence, counting only by triggers in one direction in accordance with this invention will also have a beneficial effect.

It will thus be seen that the objects set forth above, and those made apparent from the preceding description, are effectively attained and, since certain changes may be made in the above construction without departing from the spirit and scope of the invention, it is intended that all matter contained in the above description or show in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In an FSK demodulation circuit including a zero-cross detection circuit to demodulate a received binary signal, said binary signal being produced by frequency shift keying techniques whereby marks and spaces are transmitted at different selected frequencies, the improvement comprising:

a signal period counter, said signal period counter including a plurality N of counter sections;

a counter section selector circuit, said selector circuit selecting said counter sections in sequence for reading out a count at every detected zero-cross of said received binary signal, said selector circuit selecting said counter sections in sequence for resetting each of said counter sections, counting pulses from a clock and holding the count accumulated in each of said counter sections between said resetting and said reading out, said count being detected to determine whether said received frequency signal represents one of a mark and a space, said counting period for each of said counter sections equalling N zero-cross detection periods, whereby the signal-to-noise ratio of said demodulation circuit is enhanced by an increase in the number of accumulated counts by a factor of N, relative to a substantially unvarying noise input.

2. A FSK demodulation circuit as claimed in claim 1, and further comprising a clock signal generator, the output of said clock generator being applied to each of said counter sections.

3. An FSK demodulation circuit for receiving and demodulating an analog signal, said analog signal being modulated in response to a binary signal, said analog comprising one of an originate pair of analog frequencies respectively corresponding to a binary "1" and a binary "0" and an answer pair of analog frequencies respectively corresponding to a binary "1" and a binary "0", said answer pair of analog frequencies being distinct from said originate pair of analog frequencies, the demodulation circuit comprising:

clock means for generating a clock signal having one of a first clock frequency and a second clock frequency;

switched capacitor band pass filter means having said analog and said clock signal as inputs, said switched capacitor band pass filter means passing said originate pair of analog frequencies when said clock signal is at said first clock frequency, said switched capacitor band pass filter means passing said answer pair of analog frequencies when said clock signal is at said second clock frequency;

means coupled to said clock means for selecting one of the clock signals to be generated;

period counter means, said period counter means comprising N counter sections; and counter section selector means, said selector means selecting said counter sections in sequence to read out a count at every detected zero-cross of said analog signal, said counter section selector means selecting said counter sections in sequence for resetting, counting pulses from a clock, and holding the count which is accumulated in each of said counter sections between said resetting and said reading out, said count being detected to determine whether said binary signal represents a binary "1" or a binary "0", said counting period for each of said counter sections equalling N zero-cross detection periods.

4. An FSK demodulation circuit, as claimed in claim 3, and including switching means for switching said clock signal between said first clock frequency and said second clock frequency.

5. An FSK demodulation circuit, as claimed in claim 4, wherein said frequency of said clock signal is selected to be several tens times the frequency of said analog signal.

6. An FSK demodulation circuit for receiving and demodulating first and second analog signals which are modulated in response to a binary signal, said first analog signal comprising one of a first pair of analog frequencies respectively corresponding to a binary "1" and a binary "0" and a second pair of analog frequencies respectively corresponding to a binary "1" and binary "0", said second pair of analog frequencies being distinct from said first pair of analog frequencies, said second analog signal comprising a third pair of analog frequencies respectively corresponding to a binary "1" and a binary "0" and a fourth pair of analog frequencies respectively corresponding to binary "1" and a binary "0", said third and fourth pairs of analog frequencies being distinct from each other and from said first and second pair of analog frequencies, the demodulation circuit comprising:

clock means for generating a clock signal having one of a first clock signal and a second clock signal as an output, said first clock signal comprising one of a first clock frequency and a second clock frequency and said second clock signal comprising one of a third clock frequency and a fourth clock frequency;

first switched capacitor band pass filter means having said analog signal and said clock signal as inputs, said first switched capacitor band pass filter means passing said first pair of analog frequencies when said clock signal is at said first clock frequency and said first switched capacitor band pass filter means passing said second pair of analog frequencies when said clock signal is at said second clock frequency;

second switched capacitor band pass filter means having said analog signal and said clock signal as inputs, said second switched capacitor band pass filter means passing said third pair of analog frequencies when said clock signal is at said third clock frequency and said second switched capacitor band pass filter means passing said fourth pair of analog frequencies when said clock signal is at said fourth clock frequency;

means coupled to said clock means for selecting one of the clock signals to be generated;

period counter means, said period counter means comprising N counter sections; and counter section selector means, said selector means selecting said counter sections in sequence to read out a count at every detected zero-cross of said analog signal, said counter section selector selecting said counter sections in sequence for resetting, counting pulses from a clock, and holding the count which is accumulated in each of said counter sections between said resetting and said reading out, said count being detected to determine whether said received binary signal represents a binary "1" or a binary "0", said counting period for each of said counter sections equalling N zero-cross detection periods.

7. An FSK demodulation circuit in accordance with claim 6 wherein the values of the four clock frequencies are a set of four clock frequencies respectively corresponding to a CCITT originate pair, to one of a CCITT originator pair and a CCITT answer pair, and a Bell originate pair and a Bell answer pair.

* * * * *